United States Patent
Gong et al.

(10) Patent No.: US 10,506,747 B2
(45) Date of Patent: Dec. 10, 2019

(54) MOUSE FOR MAGNETIC RESONANCE, MANUFACTURING METHOD THEREOF, AND SIGNAL TRANSMISSION APPARATUS CONTAINING THE SAME

(71) Applicant: WEST CHINA HOSPITAL, SICHUAN UNIVERSITY, Chengdu, Sichuan (CN)

(72) Inventors: Qiyong Gong, Sichuan (CN); Huaiqiang Sun, Sichuan (CN); Lefeng Ren, Sichuan (CN); Haoyang Xing, Sichuan (CN); Jie Tang, Sichuan (CN); Xiaoqi Huang, Sichuan (CN); Youjin Zhao, Sichuan (CN)

(73) Assignee: WEST CHINA HOSPITAL, SICHUAN UNIVERSITY, Chengdu, Sichuan (CN)

( * ) Notice: Subject to any disclaimer, the term of this patent is extended or adjusted under 35 U.S.C. 154(b) by 60 days.

(21) Appl. No.: 15/546,993

(22) PCT Filed: Feb. 12, 2015

(86) PCT No.: PCT/CN2015/072900
§ 371 (c)(1),
(2) Date: Jul. 27, 2017

(87) PCT Pub. No.: WO2016/127362
PCT Pub. Date: Aug. 18, 2016

(65) Prior Publication Data
US 2018/0035574 A1 Feb. 1, 2018

(51) Int. Cl.
*H05K 9/00* (2006.01)
*G06F 3/033* (2013.01)
(Continued)

(52) U.S. Cl.
CPC ....... *H05K 9/0007* (2013.01); *G01R 33/4806* (2013.01); *G01R 33/546* (2013.01);
(Continued)

(58) Field of Classification Search
CPC ...... G06F 3/015; G06F 3/033; G06F 3/03543; G06F 3/038; G06F 13/4282;
(Continued)

(56) References Cited

U.S. PATENT DOCUMENTS 5,670,990 A * 9/1997 Bidiville ............... G06F 3/0312
345/164
7,666,568 B2 * 2/2010 Gao ................... B41M 5/38207
430/200
(Continued)

FOREIGN PATENT DOCUMENTS

| CN | 1769358 A | 5/2006 |
|---|---|---|
| CN | 101228499 A | 7/2008 |

(Continued)

*Primary Examiner* — Sahlu Okebato
(74) *Attorney, Agent, or Firm* — Novick, Kim & Lee, PLLC; Allen Xue

(57) ABSTRACT

A mouse for magnetic resonance, comprising an upper shell (1), a lower shell (2), a trackball (3), a circuit board (4) and a cable (5), wherein the inner surfaces of the upper shell (1) and the lower shell (2) are coated with a silver and copper conductive paint layer, the concentration of a silver and copper conductive paint being 13% to 17%; and a manufacturing method for the mouse for magnetic resonance, and a signal transmission apparatus are further comprised. The clinical usage of functional magnetic resonance can be satisfied, a signal interference is avoided, and it is ensured that a remote computer accurately receives a response of a subject.

8 Claims, 2 Drawing Sheets

(51) Int. Cl.
*G06F 3/0354* (2013.01)
*G06F 13/42* (2006.01)
*H05K 1/02* (2006.01)
*G06F 3/01* (2006.01)
*G06F 3/038* (2013.01)
*G01R 33/48* (2006.01)
*G01R 33/54* (2006.01)

(52) U.S. Cl.
CPC .............. *G06F 3/015* (2013.01); *G06F 3/033* (2013.01); *G06F 3/038* (2013.01); *G06F 3/03543* (2013.01); *G06F 13/4282* (2013.01); *H05K 1/0216* (2013.01); *H05K 9/0092* (2013.01); *G06F 2213/0042* (2013.01)

(58) Field of Classification Search
CPC .......... G06F 2213/0042; H05K 9/0007; H05K 1/0092; G01R 33/4806; G01R 33/546
See application file for complete search history.

(56) References Cited

U.S. PATENT DOCUMENTS

| 2004/0093391 | A1* | 5/2004 | Chen | ..................... | G08C 17/02 |
| | | | | | 709/217 |
| 2006/0274042 | A1* | 12/2006 | Krah | .................... | G06F 3/03543 |
| | | | | | 345/163 |
| 2012/0176316 | A1* | 7/2012 | Jin | ........................ | G06F 1/1635 |
| | | | | | 345/163 |
| 2012/0273257 | A1 | 11/2012 | Chu | | |
| 2015/0202842 | A1* | 7/2015 | Dong | .................... | C23C 12/02 |
| | | | | | 428/666 |

FOREIGN PATENT DOCUMENTS

| CN | 102814496 A | 12/2012 |
| CN | 102855002 A | 1/2013 |
| CN | 103451632 A | 12/2013 |

* cited by examiner

MOUSE FOR MAGNETIC RESONANCE, MANUFACTURING METHOD THEREOF, AND SIGNAL TRANSMISSION APPARATUS CONTAINING THE SAME

FIELD OF THE INVENTION

The present invention relates to a medical device, and specifically to a mouse for magnetic resonance.

DESCRIPTION OF THE RELATED ART

At present, the functional magnetic resonance technology is the most commonly used technology for studying the brain function. During functional magnetic resonance experiment, the subject needs to response to the stimulus. Nowadays, a keyboard with a few keys (2-4 keys) are commonly used as a feedback device, which can only sent and receive some simple response. In order to study the response of brain to complex task, the functional magnetic resonance experiment always involves more complex stimulus and the subject needs to make more complex responses; however, feedbacks made by means of conventional keyboard cannot satisfy such requirements.

At present, the mouse is the most commonly used cursor indicator that is used for the human beings and the computers to interact with each other. However, currently used commercial mouse cannot be directly used for magnetic resonance environment. First of all, the mouse has a lot of metal components, which will seriously impact the imaging quality. Secondly, when imaging by means of magnetic resonance, gradient magnetic field induced by fast switch will produce induced current in the wires of the mouse, thus making the remote computer cannot properly receive a response from a subject.

SUMMARY OF THE INVENTION

The object of the present invention is to provide a mouse for magnetic resonance, which can satisfy the clinical usage of functional magnetic resonance, can avoid the signal interference, and can ensure that a remote computer will accurately receive a response from a subject.

The technical solution applied by the invention to achieve such object is as follows:

A mouse for magnetic resonance disclosed by the present invention comprises an upper shell, a lower shell, a trackball, a circuit board and a cable, and the inner surfaces of the upper shell and the lower shell are coated with a silver and copper conductive paint layer with silver and copper conductive paint having a concentration of 13%-17%.

Preferably, the concentration of the silver and copper conductive paint is 15%.

Preferably, the thickness of the silver and copper conductive paint layer is no less than 18 μm.

Preferably, the electrical resistivity of the silver and copper conductive paint layer is less than 1Ω/a film thickness of 20 μm/a distance of 10 cm.

Further, said circuit board and screws used to mount the circuit board are non-magnetic elements.

Further, said cable is a fully-shielded USB cable, and a shielding layer of said fully-shielded USB cable is connected to the silver and copper conductive paint layer of the upper shell or the lower shell.

The present invention also discloses a manufacturing method for the mouse for magnetic resonance, comprising the following steps:

Step 1, taking a commercial USB apart, and separating the circuit board, the cable, the upper shell and the lower shell;

Step 2, diluting commercial silver and copper conductive paint to a concentration of 13%-17% by adding absolute ethyl alcohol, stirring the silver and copper conductive paint for no less than 5 minutes when diluting;

Step 3, applying or spraying the diluted silver and copper conductive paint onto the inner surfaces of the upper shell and the lower shell;

Step 4, air drying the upper shell and the lower shell, which are coated with the silver and copper conductive paint layer in the shade, for no less than 2 hours;

Step 5, baking the air dried upper shell and lower shell, the baking temperature of the baking process being 65° C., the baking time being no less than 30 minutes;

Step 6, detecting the electrical resistivity of the inner surfaces of the baked upper shell and lower shell;

Step 7, replacing the circuit board and screws used to mount the circuit board with non-magnetic elements, replacing the original cable with fully-shielded USB cable, and connecting the shielding layer of fully-shielded USB cable to the silver and copper conductive paint layer of the upper shell or the lower shell.

Preferably, diluting the commercial silver and copper conductive paint to a concentration of 15% by adding absolute ethyl alcohol.

The present invention also discloses a signal transmission apparatus used for the mouse for magnetic resonance; the signal transmission apparatus comprises a transmitter that is connected to the mouse and a receiver that is connected to a remote computer; the transmitter comprises a USB connector, a USB HOST interface chip, a first processor, a first level translator, a first fiber transceiver and a first fiber connector, which are sequentially connected; the receiver comprises a second fiber connector, a second fiber transceiver, a second level translator, a second processor and a USB SLAVE interface chip, which are sequentially connected; the first fiber connector and the second fiber connector are connected by fiber. During the clinical usage of of the magnetic resonance, the mouse and the transmitter are located in the shielded room, and the receiver and the remote computer are located in the operation room.

Preferably, the first processor and the second processor are both single chips.

The operating principle of said signal transmission apparatus is as follows:

USB connector is used for the USB keyboard and the mouse to be inserted therein; USB HOST interface chip sents HID information of USB to the first processor; after the first processor has processed the HID information, the HID information is transmitted to the first fiber transceiver via the first level translator, and then enters the fiber.

The second fiber transceiver receives the information transmitted from the fiber, and transforms it into electrical signal, which is transmitted to the second processor via the second level translator; the second processor sent the information to USB SLAVE chip; and the USB SLAVE chip restore such information back into HID information, and then sents it to the remote computer.

The mouse for magnetic resonance disclosed by the invention can satisfy the clinical usage of functional magnetic resonance, and can avoid the signal interference. The invention also discloses a signal transmission apparatus used for the mouse for magnetic resonance, which use optical transmission to avoid electromagnetic interference of the signals, and ensure that a remote computer will accurately receive a response from a subject. The invention also discloses a manufacturing method for the mouse for magnetic resonance, which can refit a common commercial mouse, so that the manufacturing process is simple and the cost is low.

DETAILED DESCRIPTION OF THE PREFERRED EMBODIMENTS

In order to make the objects, technical solutions and advantages of the invention clearer, in the following, the invention will be explained in details with reference to the accompanying drawings.

Figure 1:
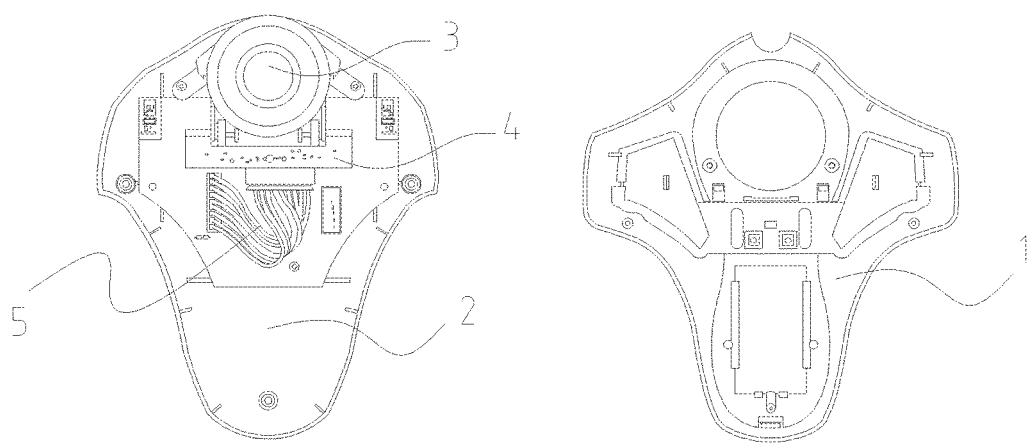
FIG. 1 is an exploded view of the mouse of the invention.

As shown in FIG. 1, a mouse for magnetic resonance disclosed by the invention comprises an upper shell 1, a lower shell 2, a trackball 3, a circuit board 4 and a cable 5. The inner surfaces of the upper shell 1 and the lower shell 2 are coated with a silver and copper conductive paint layer having a concentration of 13%-17%, and the preferable concentration is 15%. The thickness of the silver and copper conductive paint layer is no less than 18 μm. The electrical resistivity of the silver and copper conductive paint layer is less than 1Ω/a film thickness of 20 μm/a distance of 10 cm. The circuit board 4 and screws used to mount the circuit board are non-magnetic elements. The cable 5 a fully-shielded USB cable, a shielding layer of said fully-shielded USB cable is connected to the silver and copper conductive paint layer of the upper shell or the lower shell.

The present invention also discloses a manufacturing method for the mouse for magnetic resonance, which comprises the following steps:

Step 1, taking a commercial USB apart, and separating the circuit board 4, the cable, the upper shell 1 and the lower shell 2;

Step 2, diluting commercial silver and copper conductive paint to a concentration of 13%-17% (preferably, 15%) by adding absolute ethyl alcohol, stirring the silver and copper conductive paint for no less than 5 minutes when diluting;

Step 3, applying or spraying the diluted silver and copper conductive paint onto the inner surfaces of the upper shell 1 and the lower shell 2;

Step 4, air drying the upper shell and the lower shell, which are coated with the silver and copper conductive paint layer in the shade, for no less than 2 hours;

Step 5, baking the air dried upper shell 1 and lower shell 2, the baking temperature of the baking process being 65° C., the baking time being no less than 30 minutes.

Step 6, detecting the electrical resistivity of the inner surfaces of the baked upper shell 1 and lower shell 2. The measurement is performed by a digital multimeter (normally, the scale of the multimeter should be adjusted to be smaller than 200Ω), and the resistance of the multimeter itself and the resistance of the wire should be subtracted from the measurement result should. When the electrical resistivity is less than 1Ω/a film thickness of 20 μm/a distance of 10 cm, it can determined that it is qualified.

Step 7, replacing the circuit board and screws used to mount the circuit board with non-magnetic elements, replacing the original cable with a fully-shielded USB cable, and connecting the shielding layer of fully-shielded USB cable to the silver and copper conductive paint layer of the upper shell or the lower shell.

At the end, the mouse can be assembled again.

Figure 2:
FIG. 2 is a functional block diagram of the signal transmission apparatus of the invention.
Figure 3:
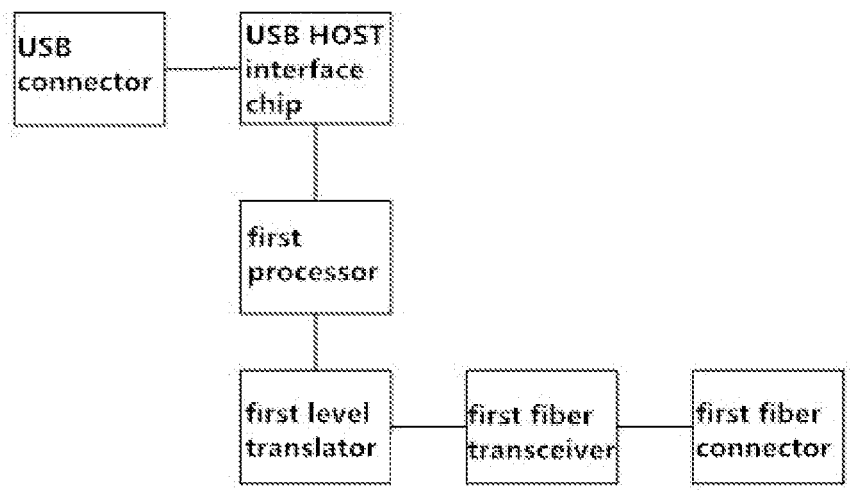
FIG. 3 is a functional block diagram of the transmitter.
Figure 4:
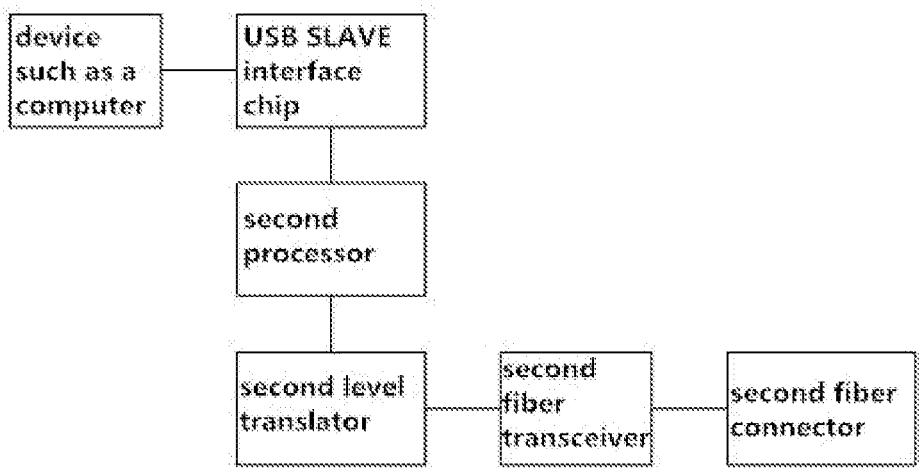
FIG. 4 is a functional block diagram of the receiver.

As shown in FIG. 2, FIG. 3 and FIG. 4, the present invention also discloses a signal transmission apparatus used for the mouse for magnetic resonance. the signal transmission apparatus comprises a transmitter that is connected to the mouse and a receiver that is connected to a remote computer; the transmitter comprises a USB connector, a USB HOST interface chip, a first processor, a first level translator, a first fiber transceiver and a first fiber connector, which are sequentially connected; the receiver comprises a second fiber connector, a second fiber transceiver, a second level translator, a second processor and a USB SLAVE interface chip, which are sequentially connected; the first fiber connector and the second fiber connector are connected by fiber. wherein, the first processor, the second processor are both single chips.

Obviously, the invention may have other embodiments. Many modifications and alternatives can be made by a person skilled in the art without departing from the spirit and its essence of the invention, and such modifications and alternative also fall within the scope of protection of claims of the invention.

The invention claimed is:

1. A mouse, comprising: a housing, a trackball and a circuit board disposed inside a cavity formed by the housing, and a cable connected to the housing, wherein the housing comprises an upper shell and a lower shell, and an inner surface of the upper shell and an inner surface of the lower shell are coated with a silver and copper conductive paint layer, and a concentration of silver and copper in the conductive paint is 13%-17%, wherein said cable is a full-shielded USB cable, and a shielding layer of said fully-shielded USB cable is connected to the silver and copper conductive paint layer on the upper shell or the lower shell.

2. The mouse according to claim 1, wherein the concentration of the silver and copper in the conductive paint is 15%.

3. The mouse according to claim 1, wherein a thickness of the silver and copper conductive paint layer is no less than 18 pm.

4. The mouse according to claim 1, wherein an electrical resistivity of the silver and copper conductive paint layer is less than 10/a film thickness of 20 pm/a distance of 10 cm.

5. The mouse according to claim 1, wherein said circuit board and screws used to mount the circuit board are non-magnetic.

6. A signal transmission apparatus, comprising: a transmitter connected to the mouse of claim 1 and a receiver connected to a remote computer, wherein the transmitter comprises a USB connector, a USB HOST interface chip, a first processor, a first level translator, a first fiber transceiver and a first fiber connector that are sequentially connected and the receiver comprises a second fiber connector, a second fiber transceiver, a second level translator, a second processor and a USB SLAVE interface chip that are sequentially connected and wherein the first fiber connector and the second fiber connector are connected by an optical fiber.

7. The signal transmission apparatus according to claim 6, wherein the first processor is disposed on a first single chip and the second processor is disposed on a second single chip.

8. The mouse according to claim 1, wherein the mouse avoids signal interference in a magnetic field.

\* \* \* \* \*